(12) United States Patent
Gong et al.

(10) Patent No.: US 11,653,578 B2
(45) Date of Patent: May 16, 2023

(54) PHASE-CHANGE MATERIAL-BASED XOR LOGIC GATES

(71) Applicant: International Business Machines Corporation, Armonk, NY (US)

(72) Inventors: Nanbo Gong, White Plains, NY (US);
Guy M. Cohen, Ossining, NY (US);
Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 17/108,277

(22) Filed: Dec. 1, 2020

(65) Prior Publication Data

US 2022/0173309 A1 Jun. 2, 2022

(51) Int. Cl.
*H01L 45/00* (2006.01)
*G11C 13/00* (2006.01)
*H01L 27/24* (2006.01)

(52) U.S. Cl.
CPC .......... *H01L 45/06* (2013.01); *G11C 13/0004* (2013.01); *H01L 27/2436* (2013.01); *H01L 45/126* (2013.01); *G11C 2013/008* (2013.01)

(58) Field of Classification Search
CPC ... H01L 45/06; H01L 27/2436; H01L 45/126; H01L 45/1286; G11C 13/0004; G11C 2013/008
See application file for complete search history.

(56) References Cited

U.S. PATENT DOCUMENTS

| | | | |
|---|---|---|---|
| 7,505,330 B2 | 3/2009 | Pawlowski et al. | |
| 9,042,167 B2 | 5/2015 | Kwon et al. | |
| 9,613,692 B1 | 4/2017 | Pasotti et al. | |
| 10,073,733 B1 | 9/2018 | Jain et al. | |
| 10,452,531 B1 | 10/2019 | Jung et al. | |
| 2008/0186760 A1 | 8/2008 | Elmegreen et al. | |
| 2011/0266516 A1* | 11/2011 | Park | H01L 45/1233 438/54 |
| 2012/0153248 A1* | 6/2012 | Krusin-Elbaum | H01L 45/144 257/E45.001 |
| 2018/0342673 A1 | 11/2018 | Hou et al. | |

(Continued)

FOREIGN PATENT DOCUMENTS

EP 2034536 A1 3/2009
WO PCT/EP2021/079851 2/2022

OTHER PUBLICATIONS

Y. Li et al., "Nonvolatile 'and,' 'or,' and 'Not' Boolean Logic Gates Based on Phase-Change Memory," Journal of Applied Physics, Dec. 2013, 4 pages, vol. 114, No. 23.

(Continued)

*Primary Examiner* — Jerome Leboeuf (74) *Attorney, Agent, or Firm* — Erik Johnson; Ryan, Mason & Lewis, LLP (57) ABSTRACT

An apparatus comprises a phase-change material, a first electrode at a first end of the phase-change material, a second electrode at a second end of the phase-change material, and a heating element coupled to a least a given portion of the phase-change material between the first end and the second end. The apparatus also comprises a first input terminal coupled to the heating element, a second input terminal coupled to the heating element, and an output terminal coupled to the second electrode.

18 Claims, 8 Drawing Sheets

(56) References Cited

U.S. PATENT DOCUMENTS

2019/0064551 A1* 2/2019 Gooth ................ H01L 27/2481
2020/0057013 A1   2/2020 Howard et al.

OTHER PUBLICATIONS

Wikipedia, "XOR Gate," https://en.wikipedia.org/w/index.php?title=XOR_gate&oldid=936463637, Jan. 19, 2020, 5 pages.
G.W. Burr et al., "Recent Progress in Phase-Change Memory Technology," IEEE Journal on Emerging and Selected Topics in Circuits and Systems, Jun. 2016, vol. 6, No. 2, pp. 146-162.

* cited by examiner

PHASE-CHANGE MATERIAL-BASED XOR LOGIC GATES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for implementing XOR logic gates utilizing phase-change material.

In one embodiment, an apparatus comprises a phase-change material, a first electrode at a first end of the phase-change material, a second electrode at a second end of the phase-change material, and a heating element coupled to a least a given portion of the phase-change material between the first end and the second end. The apparatus also comprises a first input terminal coupled to the heating element, a second input terminal coupled to the heating element, and an output terminal coupled to the second electrode.

In another embodiment, a method comprises providing a first voltage to a first input terminal coupled to a heating element, the heating element being coupled to at least a given portion of a phase-change material between a first end of the phase-change material and a second end of the phase-change material, the first end of the phase-change material being coupled to a first electrode, the second end of the phase-change material being coupled to a second electrode. The method also comprises providing a second voltage to a second input terminal coupled to the heating element, and measuring a magnitude of a voltage at an output terminal coupled to the second electrode.

In another embodiment, a method of operating a logic gate comprises setting at least a given portion of a phase-change material to a first phase having a first resistivity in response to one of the two or more inputs to the logic gate being exclusively true, setting the given portion of the phase-change material to a second phase having a second resistivity higher than the first resistivity in response to two of the two or more inputs to the logic gate being true, and determining an output logical state of the logic gate based on a measured resistance between an input electrode coupled to a first end of the phase-change material and an output electrode coupled to a second end of the phase-change material.

In another embodiment, a system comprises two or more logic stages, each of the two or more logic stages comprising one or more logic devices. At least one of the one or more logic devices in a given one of the two or more logic stages comprises a phase-change material-based logic gate a phase-change material-based logic gate comprising a phase-change material and a heating element interconnected such that when one of first and second input terminals coupled to the heating element, exclusively, is at a true logic state, an output terminal is at a true logic state. The phase-change material-based logic gate in the given logic stage comprises an enable output terminal coupling the heating element to a logic device in another one of the two or more logic stages.

In another embodiment, a method comprises measuring a current at an enable output terminal of a first logic device in a first one of two or more logic stages, determining whether the measured current at the enable output terminal of the first logic device in the first logic stage exceeds a designated threshold enabling current, and triggering an enable input terminal of a second logic device in a second one of the two or more logic stages responsive to determining that the measured current at the enable output terminal of the first logic device in the first logic stage exceeds the designated threshold enabling current. The second logic device comprises a phase-change material-based logic gate a phase-change material-based logic gate comprising a phase-change material and a heating element interconnected such that when one of first and second input terminals coupled to the heating element, exclusively, is at a true logic state, an output terminal is at a true logic state.

DETAILED DESCRIPTION

Illustrative embodiments of the invention may be described herein in the context of illustrative methods for forming logic gates using phase-change material, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Figure 1:
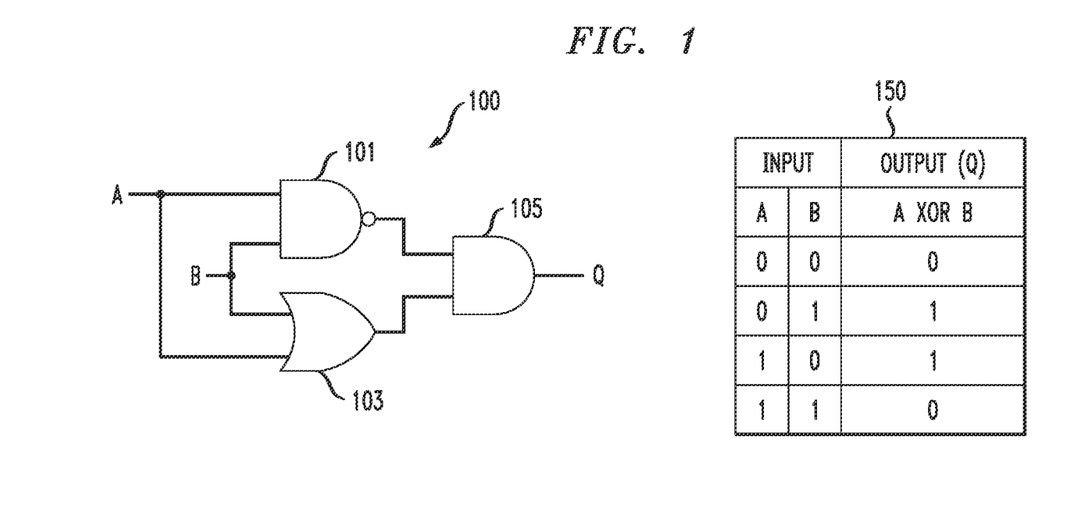
FIG. 1 depicts a circuit diagram of an XOR logic gate, according to an embodiment of the invention.

XOR ("exclusive or") is a logic operation that outputs "true" when one of two or more inputs is exclusively true (e.g., for a 2-input XOR, when its inputs differ). An XOR gate is a digital logic gate that gives a true output (e.g., 1 or high) when only one of its inputs is true. An XOR gate may be constructed using multiple other logic gates, such as a combination of an AND, OR and NOT gate. FIG. 1 shows a circuit diagram 100 of an XOR gate that is constructed using a NOT gate 101, an OR gate 103 and an AND gate 105. FIG. 1 also shows a table 150 of the XOR logic operation, where given input values for A and B, the value of the output Q is shown. No single device is currently available for representing XOR logic. Instead, as shown in the circuit diagram 100 of FIG. 1, multiple devices are used to represent XOR logic.

Illustrative embodiments provide structures for performing XOR logic that require only a single phase-change memory (PCM) device. Thus, embodiments can significantly improve density as a single PCM device is used to replace conventional transistors used to perform XOR logic. Some embodiments further utilize a heater design for the PCM device and sets of enable terminals for multi-stage logic structures.

PCM is a type of non-volatile computer memory. PCM devices use the behavior of certain materials, such as chalcogenide glass, which can be "switched" between two states (e.g., a crystalline and an amorphous state) with the application of heat. Chalcogenide glass is an example of a phase-change material, where a phase-change material is characterized in that it exists in two main states (e.g., a crystalline and an amorphous state). In the amorphous state, the chalcogenide glass or other phase-change material has a first resistance (e.g., a high resistance) while in the crystalline state the chalcogenide glass or other phase-change material has a second resistance (e.g., a low resistance) different than the first resistance. As such, the phase-change material may be used to represent one of two binary states.

To convert a phase-change material between the crystalline and the amorphous state, current may be applied such that the temperature of the phase-change material is altered. For example, to "reset" a phase-change material (e.g., a chalcogenide glass) from the crystalline to the amorphous state, a high current may be applied such that the temperature of the phase-change material exceeds about 600 degrees Celsius (° C.). This may require application of a pulse of current lasting a few nanoseconds to the phase-change material. To "set" the phase-change material (e.g., to convert the phase-change material from its amorphous state to its crystalline state), the phase-change material (e.g., a chalcogenide glass) is heated to a temperature below about 400° C. and above about 200° C., and is held at that temperature for some duration of time and is then allowed to cool according to the shape of the decay of the current pulse applied thereto. In some instances, the total time required to set the phase-change material is up to 100 nanoseconds or more. The "set" time for a phase-change material is typically substantially longer than its "reset" time. It should be noted, however, that the particular examples of set and reset times, as well as the particular temperature ranges given for the set and reset operations, are presented by way of example only. Embodiments are not limited solely to these specific values, which may vary based on the type of phase-change material utilized.

Phase-change material, as noted above, may be an amorphous-to-crystalline phase-change material such as a chalcogenide phase-change material. The phase transition of chalcogenide phase-change material is thermally driven, and bi-stable at room temperature. Chalcogenide phase-change materials include, but are not limited to, germanium antimony telluride ($Ge_xSb_yTe_z$), germanium telluride ($Ge_xTe_y$), antimony telluride ($Sb_xTe_y$), silver antimony telluride ($Ag_xSb_yTe_z$), silver indium antimony telluride ($Ag_wIn_xSb_yTe_z$), etc. In some embodiments, $Ge_2Sb_2Te_5$ is used as a phase-change material. In other embodiments, $Ge_3Sb_2Te_2$, GeTe, SbTe, or AgInSbTe may be used as the phase-change material. In these chalcogenide phase-change materials, the chalcogenide can be thermally switched between a crystalline phase and an amorphous phase. For example, a first current pulse (e.g., short, intense current pulses) may be used to Joule-heat an amorphous phase chalcogenide phase-change material (e.g., $Ge_xSb_yTe_z$) to a temperature of about 300° C., which causes the amorphous phase chalcogenide phase-change material to crystallize. A second current pulse (e.g., longer, less intense) with higher power but slower pulsing may be used to Joule-heat the crystalline phase chalcogenide phase-change material to a temperature of about 600° C. which causes the crystalline phase chalcogenide phase-change material to melt-quench into the amorphous phase.

Figure 2:
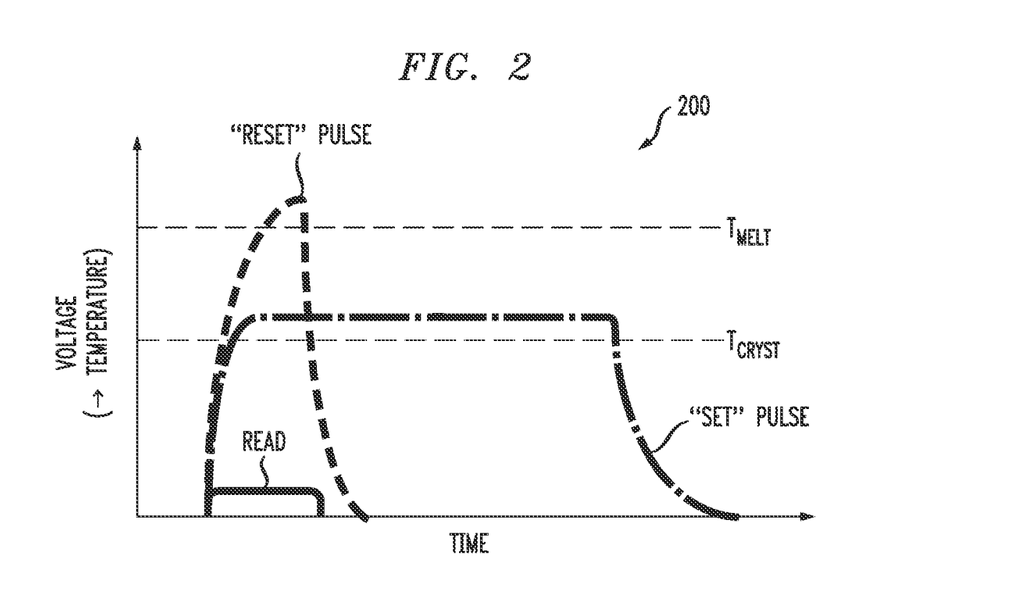
FIG. 2 depicts a plot illustrating set and reset pulses for a phase-change memory device, according to an embodiment of the invention.

FIG. 2 depicts a plot 200, illustrating applied voltage over time for a PCM device. The plot 200 illustrates how the voltage, and thus the temperature, is applied for a read of the PCM device, a set pulse, and a reset pulse. The plot 200 also shows lines illustrating the crystalline temperature ($T_{CRYST}$) and melting temperature ($T_{MELT}$) of the PCM device. As illustrated, the read operation is performed with a voltage below $T_{CRYST}$ for a relatively short duration that is typically less than a length of the reset pulse. The reset pulse uses a voltage that corresponds to a temperature above $T_{MELT}$. The set pulse uses a voltage that corresponds to a temperature above $T_{CRYST}$ and below $T_{MELT}$. The plot 200 further illustrates that the set pulse has a longer duration than the reset pulse. The reset pulse of the PCM device has a higher pulse amplitude than the set pulse (e.g., about twice the amplitude).

Figure 3:
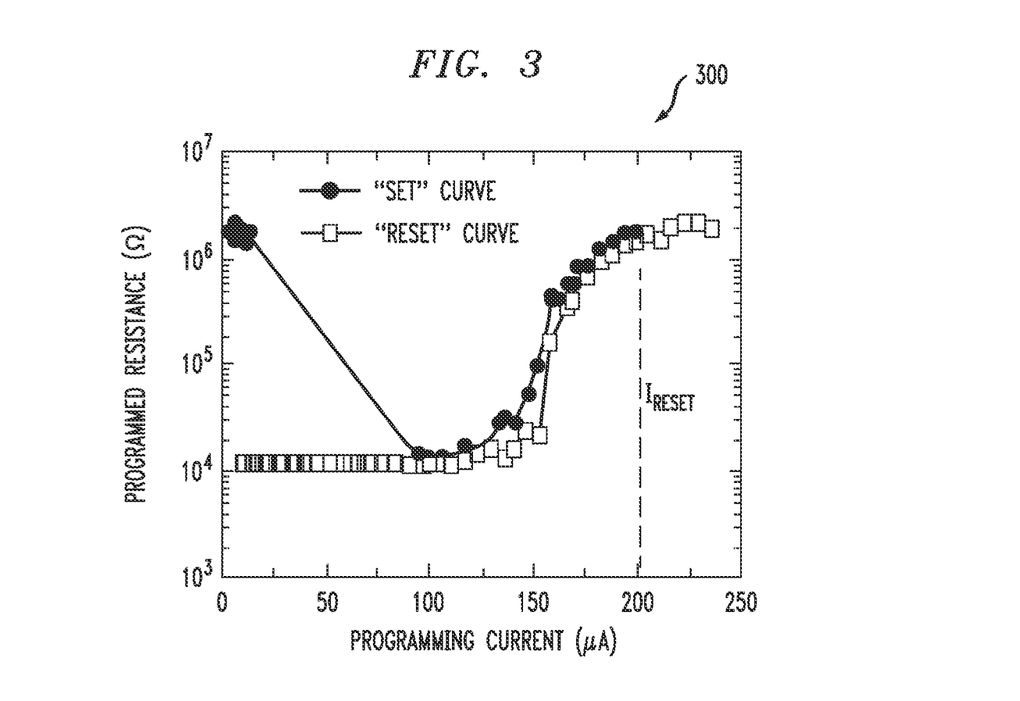
FIG. 3 depicts a plot illustrating programmed resistance and programming current for a phase-change memory device, according to an embodiment of the invention.

FIG. 3 depicts a plot 300, illustrating the programmed resistance and programming current for a PCM device. The plot 300 further illustrates set and reset curves for the PCM device. Programming current for the reset operation is approximately twice the programming current for the set operation.

Figure 4:
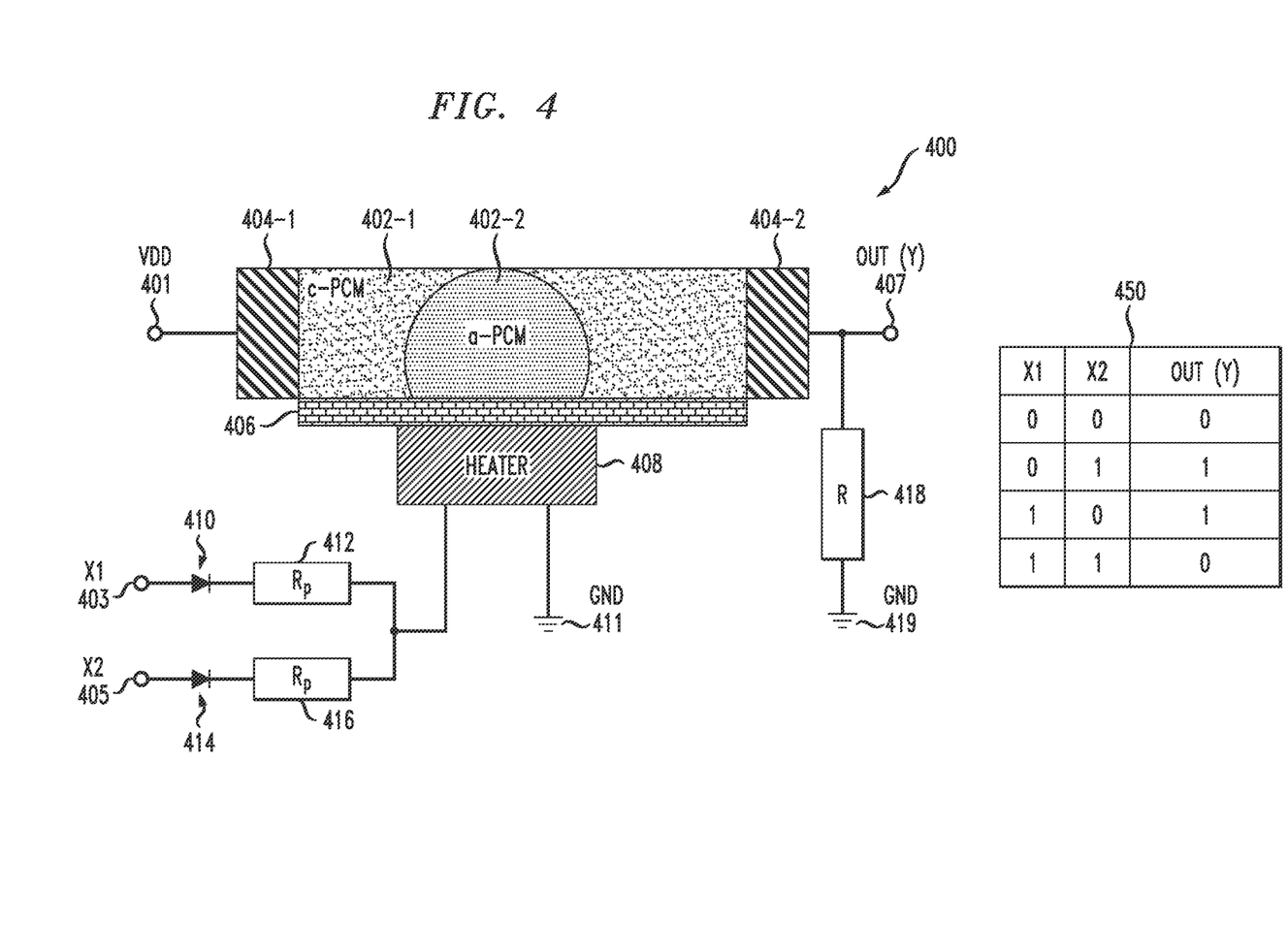
FIG. 4 depicts an XOR logic gate implemented using a phase-change memory device, according to an embodiment of the invention.

FIG. 4 depicts an XOR gate 400 that is implemented using a PCM device, also referred to herein as a PCM-based XOR gate 400. The PCM device includes a phase-change material 402, which is shown including both a crystalline (c-PCM) region 402-1 and an amorphous (a-PCM) region 402-2. In operation, the amorphous region 402-2 may be switched from a-PCM to c-PCM through application of heat using heater 408. The heater 408 is coupled to the phase-change material 402 via an insulator layer 406. The insulator layer 406 comprises a material that is an electric insulator but which provides good thermal conductivity. The insulator layer 406 is placed between the PCM 402 and the heater 408, as the heater current path is not directly mixed with the PCM current flow. The PCM device includes an input node 404-1 and an output node 404-2. The input node 404-1 is coupled to VDD 401, representing a high voltage. The input node 404-1 may also be referred to as a power supply node. The output node 404-2 is coupled to output (Y) 407. A resistive element (R) 418 is also coupled to the output node 404-2 and to ground 419, representing a low voltage.

The heater 408 is controlled by inputs X1 403 and X2 405. FIG. 4 shows a table 450 illustrating the logic of PCM-based XOR gate 400. The inputs X1 403 and X2 405 are coupled via respective diodes 410, 414 to resistive elements ($R_p$) 412, 416. The heater 408 is also coupled to ground or low voltage 411. In other embodiments, the node 411 may represent an enable output node in a multi-stage logic system. The combination of the diodes 410, 414 and resistive elements 412, 416 may provide at least a portion of a controller for the PCM-based XOR logic gate 400.

Before logic is applied to the inputs X1 403 and X2 405, the PCM device is reset into a-PCM (e.g., region 402-2 is reset as a-PCM). This may be accomplished using enable signals and an additional heater as described in further detail below. Once reset, the logic of inputs X1 403 and X2 405 are applied. FIG. 4 shows a logic table 450 for the PCM-based XOR gate 400, where a value of "1" for inputs X1 403, X2 405 means giving a voltage pulse, while a value of "0" for the inputs X1 403, X2 405 means not giving a voltage pulse (e.g., ground). For the output (Y) 407, a value of "0" means low current (e.g., high resistance) and a value of "1" means high current (e.g., low resistance). The diodes 410, 414 are used such that when X1 403 or X2 405 is 0, an "on" current goes to the associated resistive elements 412, 416, and only when X1 403 or X2 405 is 1 does a "programming" current go to the resistive elements 412, 416 and thus the heater 408. If both X1 403 and X2 405 are 1, the current is high and the region 402-2 of the PCM device is reset into a-PCM. If both X1 403 and X2 405 are 0, the region 402-2 of the PCM device is not changed. If one of X1 403 and X2 405 is 1 while the other is 0, then current is in an intermediate range such that the region 402-2 of the PCM device is set (e.g., from a-PCM to c-PCM).

Figure 5:
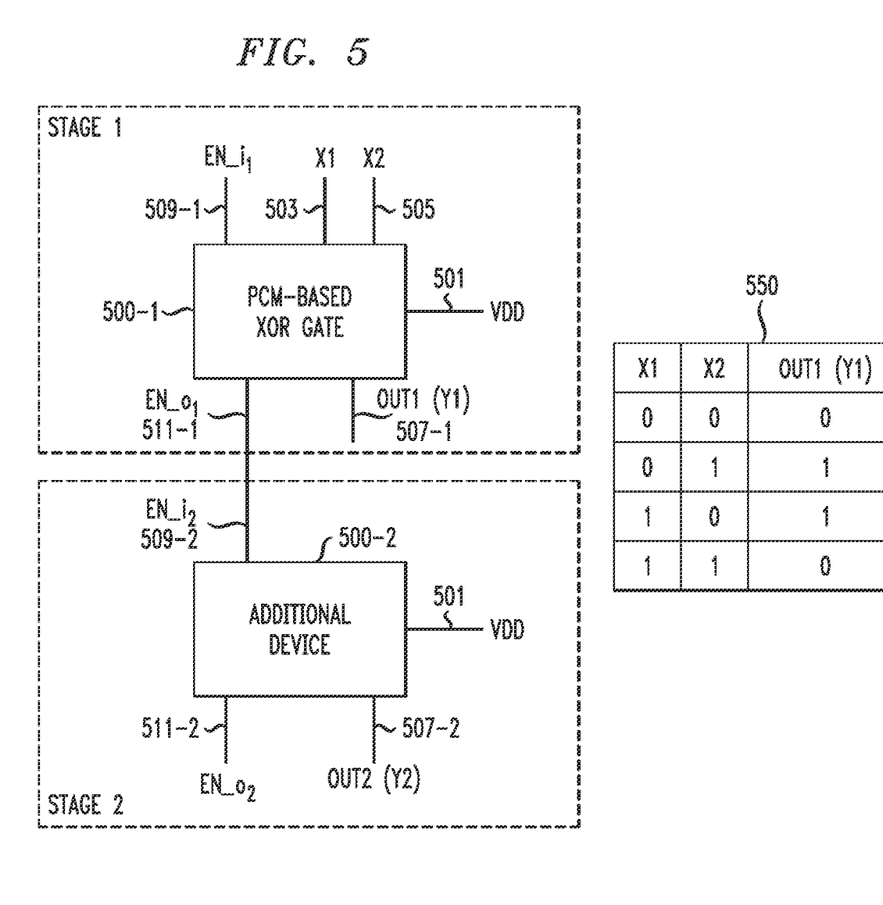
FIG. 5 depicts a multi-stage logic system using an XOR logic gate implemented using a phase-change memory device, according to an embodiment of the invention.

FIG. 5 depicts a multi-stage logic system, including a first stage with a PCM-based XOR gate 500-1, and a second stage with an additional device 500-2. The additional device 500-2 may be another XOR gate (e.g., which may but is not required to be implemented using a PCM device as described herein), a different type of logic gate (e.g., an AND, NAND, OR, NOR, NOT, etc.), or another device which uses as input at least some information from the first stage device. The multi-stage logic is provided using various enable terminals, including a first enable input terminal (EN_i$_1$) 509-1 for the PCM-based XOR gate 500-1, a first enable output terminal (EN_o$_1$) 511-1 for the PCM-based XOR gate 500-1, a second enable input terminal (EN_i$_2$) 509-2, and a second enable output terminal (EN_o$_2$) 511-2. The enable output terminal EN_o$_1$ 511-1 of the first stage, as illustrated, provides the input to the enable input terminal EN_i$_2$ 509-2 of the second stage. The first stage also has input X1 503 and X2 505 which are similar to X1 403 and X2 405 described above. Both the PCM-based XOR gate 500-1 and the additional device 500-2 are coupled to VDD 501, which similar to VDD 401 represents a high voltage. The PCM-based XOR gate 500-1 in the first stage has a first output OUT1 (Y1) 507-1, and the additional device 500-2 in the second stage has a second output OUT2 (Y2) 507-2. FIG. 5 shows a logic table 550, indicating the values of OUT1 (Y1) 507-1 given different input values for X1 503 and X2 505.

If there is a threshold enabling current level I$_{EN}$ in the first or second stage, then the enable output terminal of that stage is triggered. For example, if the current flowing through the PCM device of PCM-based XOR gate 500-1 is above I$_{EN}$, then the enable output terminal EN_o$_1$ 511-1 is triggered which in turn controls the enable input terminal EN_i$_2$ 509-2 of the second stage. If the additional device 500-2 is also a PCM-based XOR gate, then the enable input terminal EN_i$_2$ 509-2 may be used to provide a pre-reset current to an independent heater of the additional device 500-2 to generate a pre-reset condition (e.g., setting at least a portion of the phase-change material of the PCM device to a-PCM before application of inputs thereto).

In the multi-stage logic system of FIG. 5, if either or both of X1 503 and X2 505 is 1, then the enable output terminal EN_o$_1$ 511-1 in the first stage has current (e.g., I>I$_{th}$). If X1 503 and X2 505 are both 0, then OUT1 (Y1) 507-1 is 0, the PCM device is not changed, and there is no need to trigger the next level. For the second stage, if the previous stage (e.g., the first stage) enable output terminal EN_o$_1$ 511-1 is triggered, then the enable input terminal EN_i$_2$ 509-2 is triggered. Triggering the enable input terminal EN_i$_2$ 509-2 of the second stage is assumed to provide enough current to apply some operation to the additional device 500-2 in the second stage. Where the additional device 500-2 is another PCM-based XOR gate, the triggered operation would be applying enough programming current to an independent heater (e.g., different than the ones that the inputs of the additional device 500-2 will use) such that enough heat is generated to reset the phase-change material (e.g., pre-reset before application of the inputs of the additional device 500-2).

Although FIG. 5 shows a multi-stage logic system that includes only two stages for clarity of illustration, it should be appreciated that a multi-stage logic system may include three or more stages. Each stage is assumed to have an enable input terminal that is coupled to or triggered by an enable output terminal of a previous stage. Each stage is assumed to have an enable input terminal that is coupled to or triggered by an enable output terminal of a previous stage, and has an enable output terminal that is coupled to and triggers an enable input terminal of a next stage. For the last stage of the multi-stage logic system, the enable output terminal may not be needed.

Figure 6:
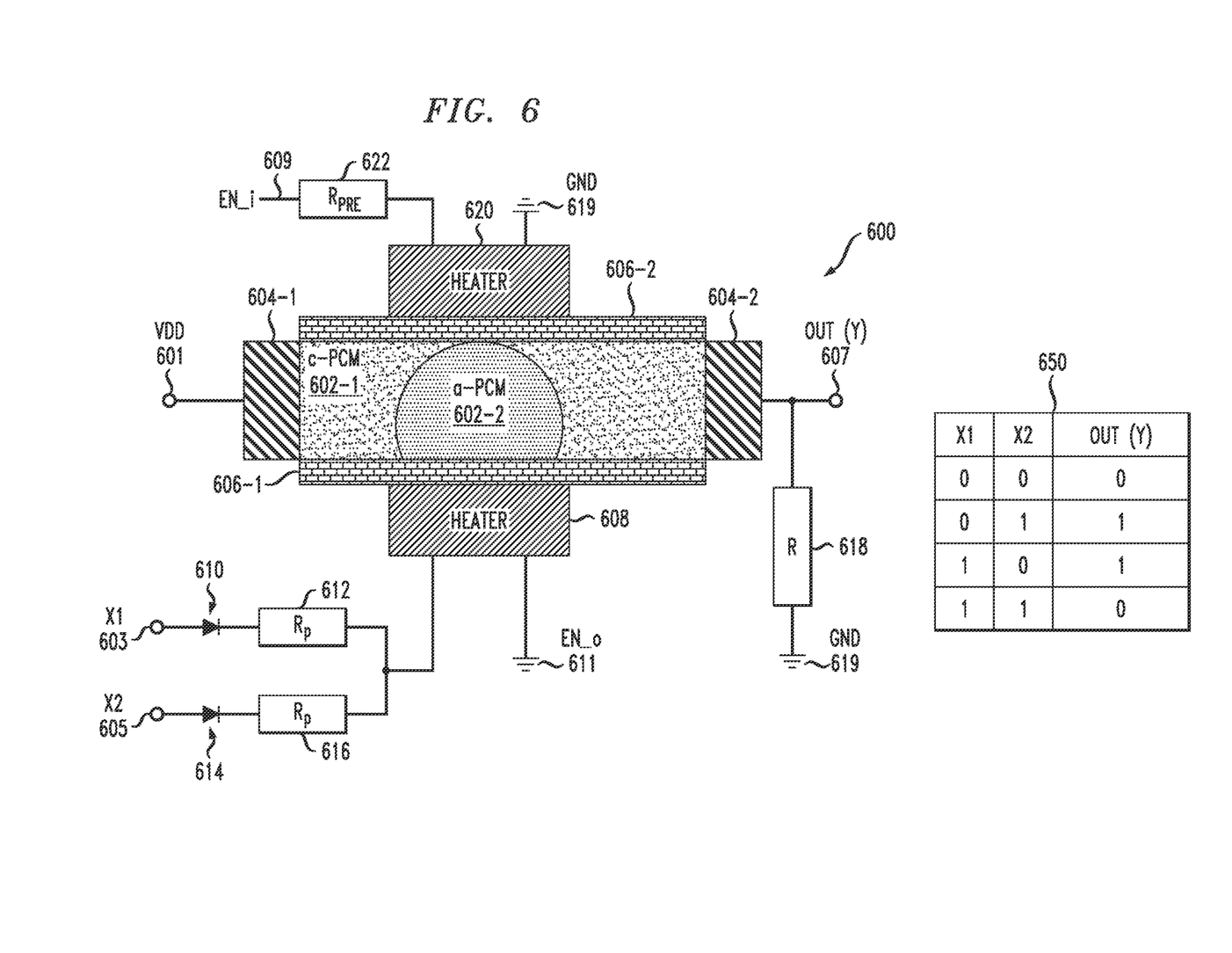
FIG. 6 depicts an XOR logic gate implemented using a phase-change memory device that is part of a multi-stage logic system, according to an embodiment of the invention.

FIG. 6 depicts an XOR gate 600 that is implemented using a PCM device, also referred to as a PCM-based XOR gate 600, which is configured for use as part of a multi-stage logic system such as that shown in FIG. 5. The PCM device includes a phase-change material 602, which is shown including both a crystalline (c-PCM) region 602-1 and an amorphous (a-PCM) region 602-2. In operation, the amorphous region 602-2 may be switched from a-PCM to c-PCM through application of heat using heater 608. The heater 608 is coupled to the phase-change material 602 via insulator layer 606-1. The PCM device includes an input node 604-1 and an output node 604-2. The input node 604-1 is coupled to VDD 601, representing a high voltage. The output node 604-2 is coupled to output (Y) 607. A resistive element (R) 618 is also coupled to the output node 604-2 and to ground 619, representing a low voltage.

The heater 608 is controlled by inputs X1 603 and X2 605. FIG. 6 shows a table 650 illustrating the logic of the PCM-based XOR gate 600. The inputs X1 603 and X2 605 are coupled via respective diodes 610, 614 to resistive elements (R$_p$) 612, 616. The heater 608 is also coupled to an enable output terminal EN_o 611. The enable output terminal EN_o 611 of the PCM-based XOR gate 600 may be coupled to an enable input terminal of another device in a multi-stage logic system as described above with respect to FIG. 5.

Before logic is applied to the inputs X1 603 and X2 605, the PCM device is reset into a-PCM (e.g., region 602-2 is reset as a-PCM). This may be accomplished using an enable input signal EN_i 609 that is assumed to be received from an earlier stage in a multi-stage logic system. The enable input signal EN_i 609 is applied to a pre-reset resistive element (R$_{PRE}$) 622, which outputs to an additional heater 620 that is independent of the heater 608. Similar to the heater 608, the heater 620 may be coupled to the PCM 602 via an insulating layer 606-2 that is electrically insulating but thermally conducting. The heater 620 also has a terminal coupled to ground 619. If the current is above a threshold enabling current level in a previous stage of the multi-stage logic system, the enable output terminal of that previous stage is triggered, which control the enable input terminal EN_i 609 providing a pre-reset current to the independent heater 620. This generates a pre-reset condition (e.g., setting the second region 602-2 of the PCM device to a-PCM before applying the inputs X1 603 and X2 605. In a similar manner, the enable output terminal EN_o 611 of the current stage will control the pre-reset condition of the next stage.

Once reset, the logic of inputs X1 603 and X2 605 are applied. FIG. 6 shows a logic table 650 for the PCM-based XOR gate 600, where a value of "1" for inputs X1, X2 means giving a voltage pulse, while a value of "0" for the inputs X1 603, X2 605 means not giving a voltage pulse (e.g., ground). For the output (Y) 607, a value of "0" means low current (e.g., high resistance) and a value of "1" means high current (e.g., low resistance). The diodes 610, 614 are used such that when X1 603 or X2 605 is 0, an "on" current goes to the associated resistive elements 612, 616, and only when X1 603 or X2 605 is 1 does a "programming" current go to the resistive elements 612, 616 and thus the heater 608. If both X1 603 and X2 605 are 1, the current is high and the region 602-2 of the PCM device is reset into a-PCM. If both X1 603 and X2 605 are 0, the region 602-2 of the PCM device is not changed. If one of X1 603 and X2 605 is 1 while the other is 0, then current is in an intermediate range such that the region 602-2 of the PCM device is set (e.g., from a-PCM to c-PCM).

Figure 7:
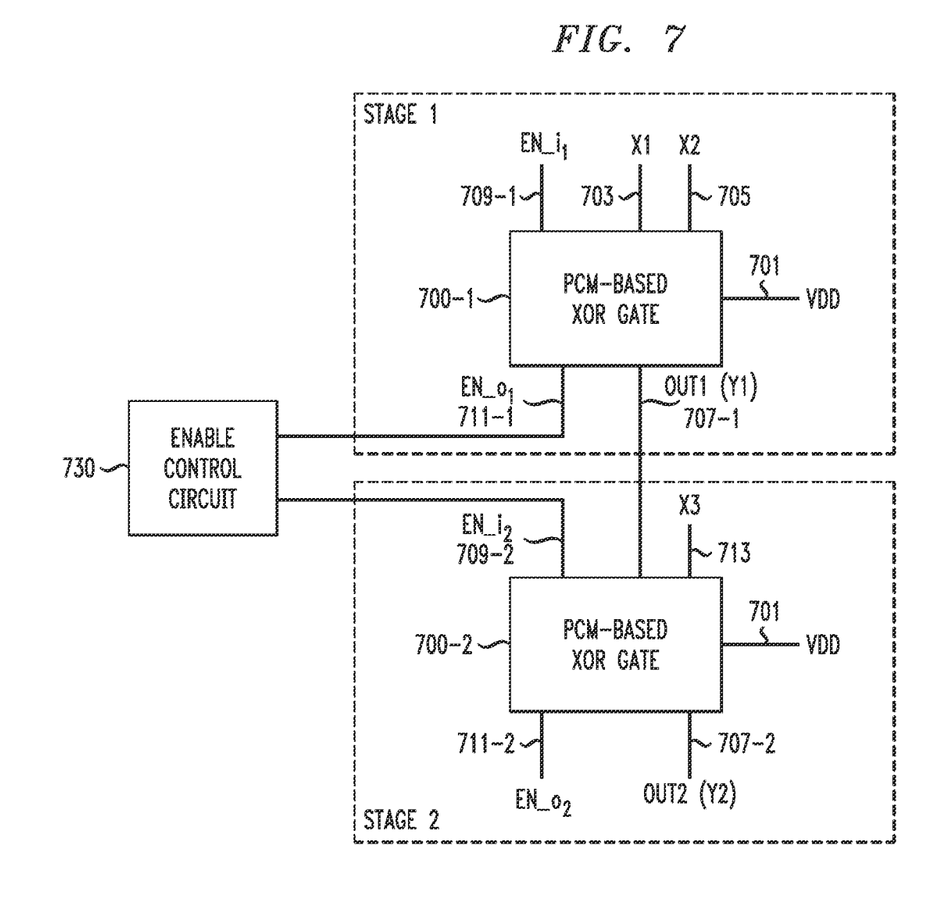
FIG. 7 depicts an enable control circuit for a multi-stage logic system using XOR logic gates implemented using phase-change memory devices, according to an embodiment of the invention.

FIG. 7 depicts a multi-stage logic system, including first and second stages with respective PCM-based XOR gates 700-1 and 700-2. It should be appreciated, however, that the first or second stage may use a different type of logic gate (e.g., an AND, NAND, OR, NOR, NOT, etc.), or another device which uses as input at least some information from a previous stage in the multi-stage system and/or provides some information as output that is used in another stage in the multi-stage system or as an overall output of the multi-stage system.

The multi-stage logic in the FIG. 7 system is provided using various enable terminals, including a first enable input terminal (EN_$i_1$) 709-1 for the PCM-based XOR gate 700-1, a first enable output terminal (EN_$o_1$) 711-1 for the PCM-based XOR gate 700-1, a second enable input terminal (EN_$i_2$) 709-2 for the PCM-based XOR gate 700-2, and a second enable output terminal (EN_$o_2$) 711-2 for the PCM-based XOR gate 700-2. The enable output terminal EN_$o_1$ 711-1 of the first stage, as illustrated, provides one of the inputs for the XOR logic of the PCM-based XOR gate 700-2, with X3 713 providing the other input (in other words, EN_o1 711-1 and X3 713 are used as the "X1" and "X2" for the PCM-based XOR gate 700-2). The first stage also has inputs X1 703 and X2 705 which are similar to X1 603 and X2 605 described above. Both the PCM-based XOR gates 700-1 and 700-2 are coupled to VDD 701, which similar to VDD 601 represents a high voltage. The PCM-based XOR gate 700-1 in the first stage has a first output OUT1 (Y1) 707-1, and the PCM-based XOR gate 700-2 in the second stage has a second output OUT2 (Y2) 707-2. The logic table for evaluating PCM-based XOR gates 700-1 and 700-2 are similar to the other logic tables 450, 550 and 650 shown in FIGS. 4-6.

If there is a threshold enabling current level $I_{EN}$ in the first or second stage, then the enable output terminal of that stage is triggered. For example, if the current flowing through the PCM device of PCM-based XOR gate 700-1 is above $I_{EN}$, then the enable output terminal EN_$o_1$ 711-1 is triggered. As shown in FIG. 7, an enable control circuit 730 is coupled between the enable output terminal 711-1 of the first stage and the enable input terminal EN_$i_2$ 709-2 of the second stage. The enable control circuit 730 is used to trigger the next stage enable input terminal EN_$i_2$ 709-2 based on whether there is a threshold enabling current level $I_{EN}$ for the enable output terminal EN_$o_1$ 711-1 of the previous stage. When the enable control circuit 730 triggers the next stage enable input terminal EN_$i_2$ 709-2, then the enable input terminal EN_$i_2$ 709-2 may be used to provide a pre-reset current to an independent heater of the PCM-based XOR gate 700-2 to generate a pre-reset condition (e.g., setting at least a portion of the phase-change material of the PCM-based XOR gate 700-2 to a-PCM before application of inputs thereto).

In the multi-stage logic system of FIG. 7, if either or both of X1 703 and X2 705 is 1, then enable output terminal EN_$o_1$ 711-1 in the first stage has current (e.g., I>$I_{th}$). If X1 703 and X2 705 are both 0, then the PCM device is not changed, and there is no need to trigger the next level and the enable output terminal EN_$o_1$ 711-1 has current below the threshold enabling current (e.g., I<$I_{EN}$). For the second stage, if the previous stage (e.g., the first stage) enable output terminal EN_$o_1$ 711-1 has current exceeding the threshold enabling current, the enable control circuit 730 triggers the enable input terminal EN_$i_2$ 709-2. Triggering the enable input terminal EN_$i_2$ 709-2 of the second stage is assumed to provide enough programming current to an independent heater (e.g., different than the ones that the inputs, OUT1 (Y1) 707-1 and X3 713, of the PCM-based XOR gate 700-2 will use) such that enough heat is generated to reset the phase-change material (e.g., pre-reset before application of the inputs OUT1 (Y1) 707-1 and X3 713 to the PCM-based XOR gate 700-2).

Although FIG. 7 shows a multi-stage logic system that includes only two stages for clarity of illustration, it should be appreciated that a multi-stage logic system may include three or more stages. Each stage is assumed to have an enable input terminal that is coupled to or triggered by an enable output terminal of a previous stage, and has an enable output terminal that is coupled to and triggers an enable input terminal of a next stage. For the last stage of the multi-stage logic system, the enable output terminal may not be needed.

Figure 8:
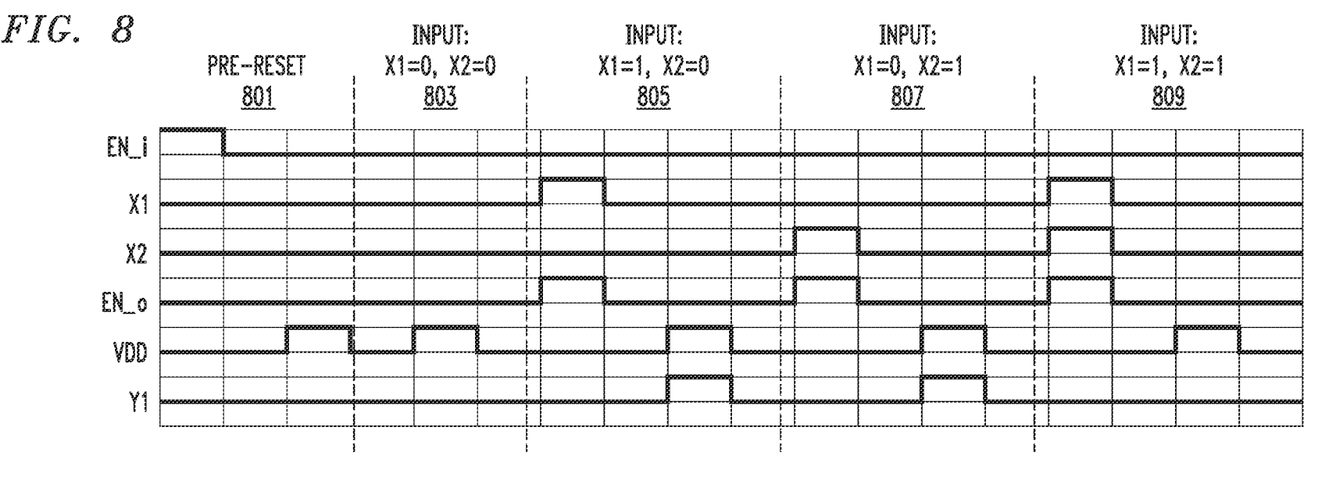
FIG. 8 depicts a timing control diagram for the FIG. 6 XOR logic gate in the FIG. 7 multi-stage logic system, according to an embodiment of the invention.

FIG. 8 shows a circuit timing diagram, illustrating control of the enable input and enable output terminals of a PCM-based XOR gate (e.g., such as that shown in FIG. 6) in a multi-stage logic system (e.g., such as that shown in FIG. 7). FIG. 8 shows a pre-reset condition 801, where the enable input terminal EN_i is high triggering a reset of the PCM device such that at least a portion of the phase-change material (e.g., region 602-2 in FIG. 6) is reset to a-PCM. FIG. 8 also shows application of different input conditions 803, 805, 807 and 809. For input condition 803, X1=0, X2=0, and both the enable output terminal EN_o and Y1 are low. For input condition 805, X1=1, X2=0, and both the enable output terminal EN_o and Y1 are high. Similarly, for input condition 807, X1=0, X2=1, and both the enable output terminal EN_o and Y1 are high. For input condition 809, X1=1, X2=1, the enable output terminal EN_o is high, and Y1 is low.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 9:
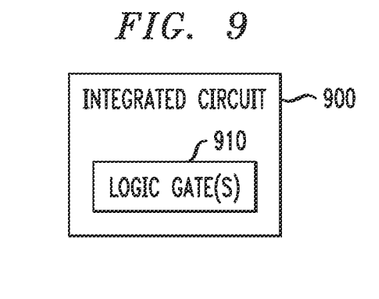
FIG. 9 depicts an integrated circuit comprising one or more logic gates, according to an embodiment of the invention.
Figure 10:
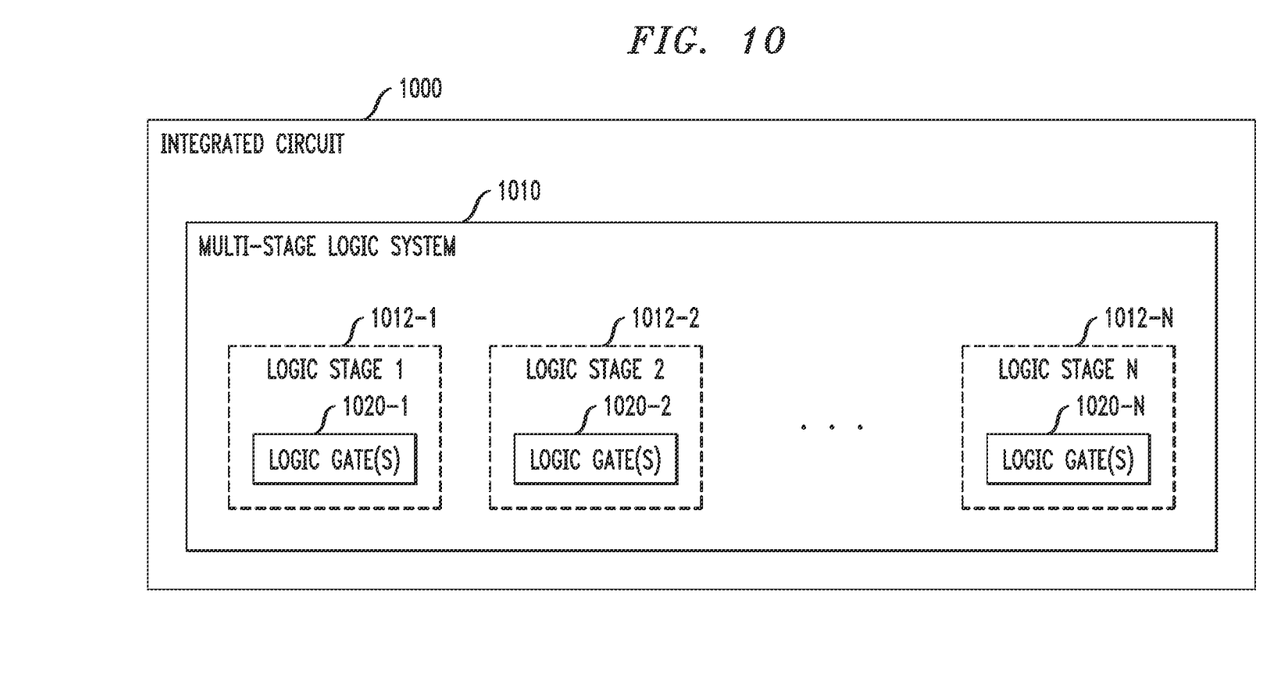
FIG. 10 depicts an integrated circuit comprising a multi-stage logic system, according to an embodiment of the invention.

FIG. 9 shows an example integrated circuit 900 which includes one or more logic gates 910, where at least one of the logic gates 910 is assumed to comprise a PCM-based XOR gate such as that described above with respect to FIGS. 4 and 6. FIG. 10 shows another example integrated circuit 1000 which includes a multi-stage logic system 1010 comprising a set of logic stages 1012-1, 1012-2, . . . , 1012-N (collectively, logic stages 1012) each implementing one or more logic gates 1020-1, 1020-2, . . . , 1020-N (collectively, logic gates 1020). Again, at least one of the logic gates 1020 is assumed to comprise a PCM-based XOR gate such as that described above with respect to FIGS. 4 and 6. At least two of the logic stages 1012 are assumed to be connected via enable input and enable output terminals such as that described above with respect to FIGS. 5 and 7.

In some embodiments, an apparatus comprises a phase-change material, a first electrode at a first end of the phase-change material, a second electrode at a second end of the phase-change material, a heating element coupled to a least a given portion of the phase-change material between the first end and the second end, a first input terminal coupled to the heating element, a second input terminal coupled to the heating element, and an output terminal coupled to the second electrode.

The first input terminal may comprise a first diode comprising a first terminal and a second terminal, and a first resistive element. The second terminal of the first diode is coupled to the first resistive element, and the first resistive element is coupled to the heating element. The second input terminal may comprise a second diode comprising a first terminal and a second terminal, and a second resistive element. The second terminal of the second diode is coupled to the second resistive element, and the second resistive element is coupled to the heating element. A first terminal of the first diode may be connected to a first voltage pulse source, and a first terminal of the second diode may be connected to a second voltage pulse source. When the first voltage pulse source does not provide the one or more first voltage pulses to the first terminal of the first diode, a first current is supplied through the first diode to the first resistive element, the first current being less than a threshold current required to supply a programming current through the first resistive element to the heating element. When the first voltage pulse source provides the one or more first voltage pulses to the first terminal of the first diode, a second current is supplied through the first diode to the first resistive element, the second current being at or greater than the threshold current required to supply the programming current through the first resistive element to the heating element. Similarly, when the second voltage pulse source does not provide the one or more second voltage pulses to the first terminal of the second diode, the first current is supplied through the second diode to the second resistive element, the first current being less than the threshold current required to supply the programming current through the second resistive element to the heating element. When the second voltage pulse source provides the one or more second voltage pulses to the first terminal of the second diode, the second current is supplied through the second diode to the second resistive element, the second current being at or greater than the threshold current required to supply the programming current through the second resistive element to the heating element.

The apparatus may further comprise an electrically insulating and thermally conducting layer disposed between the heating element and the given portion of the phase-change material.

The apparatus may further comprise an additional heating element coupled to another portion of the phase-change material between the first end and the second end, the additional heating element being coupled to an enable input terminal. The apparatus may also comprise an electrically insulating and thermally conducting layer disposed between the additional heating element and the other portion of the phase-change material.

The apparatus may further comprise an enable output terminal coupled to the heating element, the enable output terminal being coupled to an enable input terminal of an additional device.

The first input terminal may comprise a first input to a logic gate (an XOR logic gate), the second input terminal may comprise a second input to the logic gate, and the output terminal may comprise an output of the logic gate.

The heating element is configured to apply heat to the given portion of the phase-change memory material, an amount of the heat applied to the given portion of the phase-change memory material being based at least in part on an amount of current supplied to the heating element. The phase-change material in a first phase has a first resistivity and the phase-change material in a second phase has a second resistivity higher than the first resistivity. The first input terminal is configured to supply a first current to the heating element in response to one or more first voltage pulses applied to the first input terminal. The second input terminal is configured to supply a second current to the heating element in response to one or more second voltage pulses applied to the second input terminal. In response to both the first current and the second current being supplied to the heating element, the heating element is configured to apply a first level of heat to the given portion of the phase-change memory material sufficient to reset the given portion of the phase-change memory material to the second phase. In response to a single one of the first current and the second current being supplied to the heating element, the heating element is configured to apply a second level of heat to the given portion of the phase-change memory material sufficient to set the given portion of the phase-change memory material to the first phase.

In some embodiments, a method comprises providing a first voltage to a first input terminal coupled to a heating element, the heating element being coupled to at least a given portion of a phase-change material between a first end of the phase-change material and a second end of the phase-change material, the first end of the phase-change material being coupled to a first electrode, the second end of the phase-change material being coupled to a second electrode. The method also comprises providing a second voltage to a second input terminal coupled to the heating element and measuring a magnitude of a voltage at an output terminal coupled to the second electrode.

The method may further comprise determining an output value of a logic gate (an XOR logic gate) based on the measured magnitude of the voltage at the output terminal coupled to the second electrode, wherein the first input terminal comprises a first input to the logic gate, the second input terminal comprises a second input to the logic gate, and the output terminal comprises an output of the logic gate that generates a true output value when one of the first and second inputs is exclusively true.

The phase-change material in a first phase has a first resistivity and the phase-change material in a second phase has a second resistivity higher than the first resistivity, and the method may further comprise, prior to providing the first voltage to the first input terminal and prior to providing the second voltage to the second input terminal, resetting the given portion of the phase-change material to the first phase.

Providing the first voltage to the first input terminal may comprises applying one or more positive voltage pulses to the first input terminal when a value of the first input is true. Providing the second voltage to the second input terminal may comprise applying one or more positive voltage pulses to the second input terminal when a value of the second input is true. The one or more positive voltage pulses, when applied to the first input terminal, result in a first current being applied to the heating element. The one or more positive voltage pulses, when applied to the second input terminal, result in a first current being applied to the heating element. In response to both the first current and the second current being supplied to the heating element, the heating element is configured to apply a first level of heat to the given portion of the phase-change memory material sufficient to reset the given portion of the phase-change memory material to the second phase. In response to a single one of the first current and the second current being supplied to the heating element, the heating element is configured to apply a second level of heat to the given portion of the phase-change memory material sufficient to set the given portion of the phase-change memory material to the first phase.

In some embodiments, a method of operating a logic gate (e.g., an XOR logic gate) comprises setting at least a given portion of a phase-change material to a first phase having a first resistivity in response to one of the two or more inputs to the logic gate being exclusively true, setting the given portion of the phase-change material to a second phase having a second resistivity higher than the first resistivity in response to two of the two or more inputs to the logic gate being true, and determining an output logical state of the logic gate based on a measured resistance between an input electrode coupled to a first end of the phase-change material and an output electrode coupled to a second end of the phase-change material.

A heating element may be coupled to the given portion of the phase-change material between the first end and the second end, and setting the given portion of the phase-change material to the first phase may comprise applying one or more positive voltage pulses to one of a first input terminal coupled to the heating element and a second input terminal coupled to the heating element. Setting the given portion of the phase-change material to the second phase may comprise applying one or more positive voltage pulses to both of the first input terminal coupled to the heating element and the second input terminal coupled to the heating element.

In some embodiments, a system comprises two or more logic stages, each of the two or more logic stages comprising one or more logic devices. At least one of the one or more logic devices in a given one of the two or more logic stages comprises a phase-change material-based logic gate (an XOR logic gate) comprising a phase-change material and a heating element interconnected such that when one of first and second input terminals coupled to the heating element, exclusively, is at a true logic state, an output terminal is at a true logic state. The phase-change material-based logic gate in the given logic stage comprises an enable output terminal coupling the heating element to a logic device in another one of the two or more logic stages.

The phase-change material-based logic gate in the given logic stage may comprise an enable input terminal coupled to an additional heating element coupled to at least another portion of the phase-change material. The enable input terminal of the phase-change material-based logic gate in the given logic stage may be coupled to an enable output terminal of a logic device in a previous one of the two or more logic stages.

The enable output terminal of the phase-change material-based logic gate in the given logic stage may be coupled to an enable input terminal of a logic device in a subsequent one of the two or more logic stages. The logic device in the subsequent logic stage may comprise another phase-change material-based logic gate. The output terminal of the phase-change material-based logic gate in the given logic stage may be coupled to an input to another heating element coupled to a phase-change material of the other phase-change material-based logic gate in the subsequent logic stage.

In some embodiments, a method comprises measuring a current at an enable output terminal of a first logic device in a first one of two or more logic stages, determining whether the measured current at the enable output terminal of the first logic device in the first logic stage exceeds a designated threshold enabling current, and triggering an enable input terminal of a second logic device in a second one of the two or more logic stages responsive to determining that the measured current at the enable output terminal of the first logic device in the first logic stage exceeds the designated threshold enabling current. The second logic device comprises a phase-change material-based logic gate comprising a phase-change material and a heating element interconnected such that when one of first and second input terminals coupled to the heating element, exclusively, is at a true logic state, an output terminal is at a true logic state.

Triggering the enable input terminal of the second logic device may comprise controlling application of heat to the given portion of the phase-change material from an additional heating element coupled to the given portion of the phase-change material.

The phase-change material in a first phase may have a first resistivity and the phase-change material in a second phase has a second resistivity higher than the first resistivity, and triggering the enable input terminal of the second logic device may comprise resetting the given portion of the phase-change material to the second phase.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a phase-change material;
a first electrode at a first end of the phase-change material;
a second electrode at a second end of the phase-change material;
a heating element coupled to a least a given portion of the phase-change material between the first end and the second end;
a first input terminal coupled to the heating element;
a second input terminal coupled to the heating element; and
an output terminal coupled to the second electrode;
wherein the coupling of the second input terminal to the heating element is independent of the coupling of the first input terminal to the heating element such that the first input terminal and the second input terminal are configured to concurrently supply voltage pulses to the heating element.

2. The apparatus of claim 1, wherein the first input terminal comprises a first diode comprising a first terminal and a second terminal, and a first resistive element, the second terminal of the first diode being coupled to the first resistive element, the first resistive element being coupled to the heating element.

3. The apparatus of claim 2, wherein the second input terminal comprises a second diode comprising a first terminal and a second terminal, and a second resistive element, the second terminal of the second diode being coupled to the second resistive element, the second resistive element being coupled to the heating element.

4. The apparatus of claim 1, further comprising an electrically insulating and thermally conducting layer disposed between the heating element and the given portion of the phase-change material.

5. The apparatus of claim 1, further comprising an additional heating element coupled to another portion of the phase-change material between the first end and the second end, the additional heating element being coupled to an enable input terminal.

6. The apparatus of claim 5, further comprising an electrically insulating and thermally conducting layer disposed between the additional heating element and the other portion of the phase-change material.

7. The apparatus of claim 1, further comprising an enable output terminal coupled to the heating element, the enable output terminal being coupled to an enable input terminal of an additional device.

8. The apparatus of claim 1, wherein the phase-change material and the heating element form at least part of a logic gate interconnected such that when one of the first and second input terminals, exclusively, is at a true logic state, the output terminal is at a true logic state.

9. The apparatus of claim 1, wherein the first input terminal provides a first input of an exclusive or (XOR) logic gate, the second input terminal provides a second input of the XOR logic gate, and the output terminal provides an output of the XOR logic gate.

10. The apparatus of claim 1, wherein the phase-change material in a first phase has a first resistivity, and wherein the phase-change material in a second phase has a second resistivity.

11. The apparatus of claim 10, wherein:
when a positive voltage pulse is supplied at one of the first input terminal and the second input terminal and no voltage pulse is suppled at the other one of the first input terminal and the second input terminal, the phase-change material is set to the second phase having the second resistivity;

when concurrent positive voltage pulses are supplied at the first input terminal and the second input terminal, the phase-change material is reset to the first phase having the first resistivity; and when no voltage pulses are supplied at the first input terminal and the second input terminal, the phase-change material remains in the first phase having the first resistivity.

12. The apparatus of claim 11, wherein the first phase comprises an amorphous phase and the second phase comprises a crystalline phase.

13. The apparatus of claim 11, wherein the first resistivity is higher than the second resistivity.

14. The apparatus of claim 11, further comprising an additional heating element coupled to another portion of the phase-change material between the first end and the second end, the additional heating element being coupled to an enable input terminal, the additional heating element being configured, responsive to a pre-reset input to the enable input terminal, to reset the phase-change material to the first phase having the first resistivity.

15. The apparatus of claim 1, wherein the phase-change material comprises an amorphous-to-crystalline phase-change material.

16. The apparatus of claim 1, wherein the phase-change material comprises a chalcogenide phase-change material.

17. The apparatus of claim 16, wherein the chalcogenide phase-change material comprises at least one of germanium antimony telluride, germanium telluride, antimony telluride, silver antimony telluride, and silver indium antimony telluride.

18. The apparatus of claim 1, wherein the first electrode is coupled to a high voltage and the second electrode is coupled to ground via a resistive element.

* * * * *